(12) United States Patent
Watanabe (10) Patent No.: US 6,304,492 B2
(45) Date of Patent: Oct. 16, 2001

(54) SYNCHRONOUS SEMICONDUCTOR MEMORY DEVICE AND METHOD FOR READING DATA

(75) Inventor: Jun Watanabe, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/789,729

(22) Filed: Feb. 22, 2001

(30) Foreign Application Priority Data

Feb. 25, 2000 (JP) ................................................. 12-049782

(51) Int. Cl.$^7$ ......................................................... G11C 7/00
(52) U.S. Cl. ........................................ 365/189.05; 365/233
(58) Field of Search ............................... 365/233, 189.05, 365/189.12, 230.08

(56) References Cited

U.S. PATENT DOCUMENTS 5,835,448 * 11/1998 Ohtani et al. ........................ 365/233
6,170,036 * 1/2001 Konishi et al. ...................... 711/104

* cited by examiner

*Primary Examiner*—Vu A. Le
(74) *Attorney, Agent, or Firm*—Arent Fox Kintner Plotkin & Kahn, PLLC (57) ABSTRACT

A synchronous semiconductor memory device for switching an output route of read data based on latency information includes a read amplifier, a register block, a first signal route, a second signal route, and a switching circuit. The read amplifier amplifies the data read from a memory cell. The register block latches the amplified data and outputs the latched data at a timing corresponding to latency information. The first signal route is connected to the read amplifier to bypass the register block. The second signal route is connected to the read amplifier via the register block. The switching circuit is connected to the first and second signal routes and outputs either the amplified data or the latched data.

13 Claims, 10 Drawing Sheets

SYNCHRONOUS SEMICONDUCTOR MEMORY DEVICE AND METHOD FOR READING DATA

BACKGROUND OF THE INVENTION

The present invention relates to a synchronous semiconductor memory device, and more particularly, to a synchronous semiconductor memory device that sets a plurality of column address strobe (CAS) latencies.

A synchronous semiconductor memory device (synchronous SDRAM, hereafter referred to as SDRAM) reads cell information in correspondence with a predetermined CAS latency.

Figure 1:
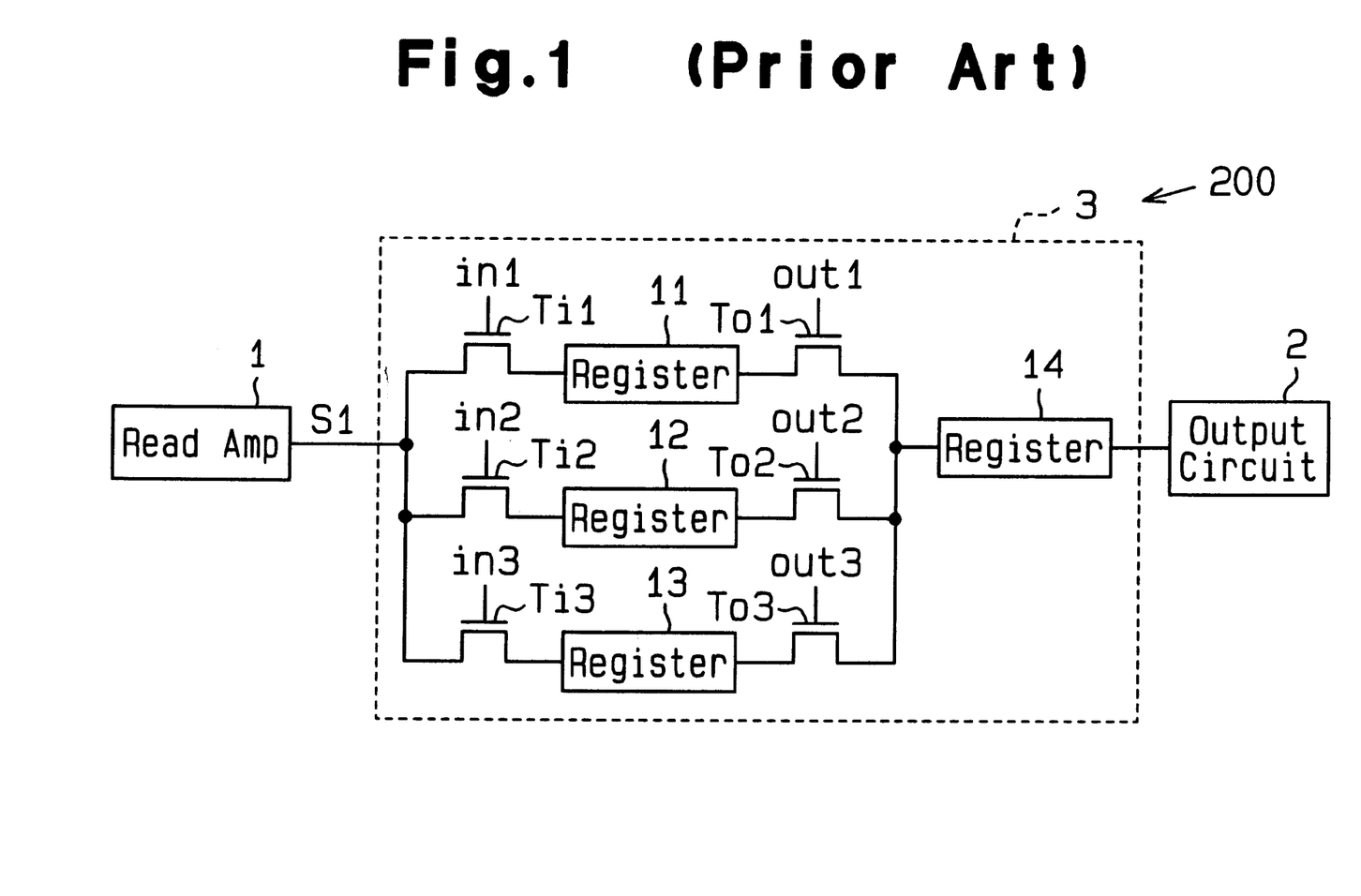
FIG. 1 is a schematic partial block circuit diagram of a prior art synchronous semiconductor memory device.

FIG. 1 is a schematic partial block circuit diagram of a prior art SDRAM 200. The SDRAM 200 receives a read command in synchronism with an external clock signal. Based on the read command, the SDRAM 200 reads cell information (data) from a memory cell to a bit line. The read data is output from external pins via a sense amplifier (not shown), a column gate (not shown), a data bus (not shown), a read amplifier 1, and an output circuit 2.

The SDRAM 200 further includes a register block 3 located between the read amplifier 1 and the output circuit 2. The register block 3 latches data based on an external clock signal and provides the latched data to the output circuit 2 in correspondence with the predetermined CAS latency.

The register block 3 includes three registers 11, 12, 13, which are connected in parallel, and a register 14. The input terminal of the register 11 is connected to a transfer gate Ti1, and the output terminal of the register 11 is connected to a transfer gate To1. The input terminal of the register 12 is connected to a transfer gate Ti2, and the output terminal of the register 12 is connected to a transfer gate To2. The input terminal of the register 13 is connected to a transfer gate Ti3, and the output terminal of the register 13 is connected to a transfer gate To3. The register 14 is connected in series to the parallel-connected registers 11–13.

The transfer gates Ti1, Ti2, Ti3, To1, To2, To3 are respectively activated and deactivated by control signals in1, in2, in3, out1, out2, out3, which are generated in correspondence with the CAS latency. The registers 11–14 latch a read data signal S1, which is provided from the read amplifier 1 to the register block 3. The latched data is output to external pins via the output circuit 2 at a timing based on the external clock signal CLK.

Figure 2:
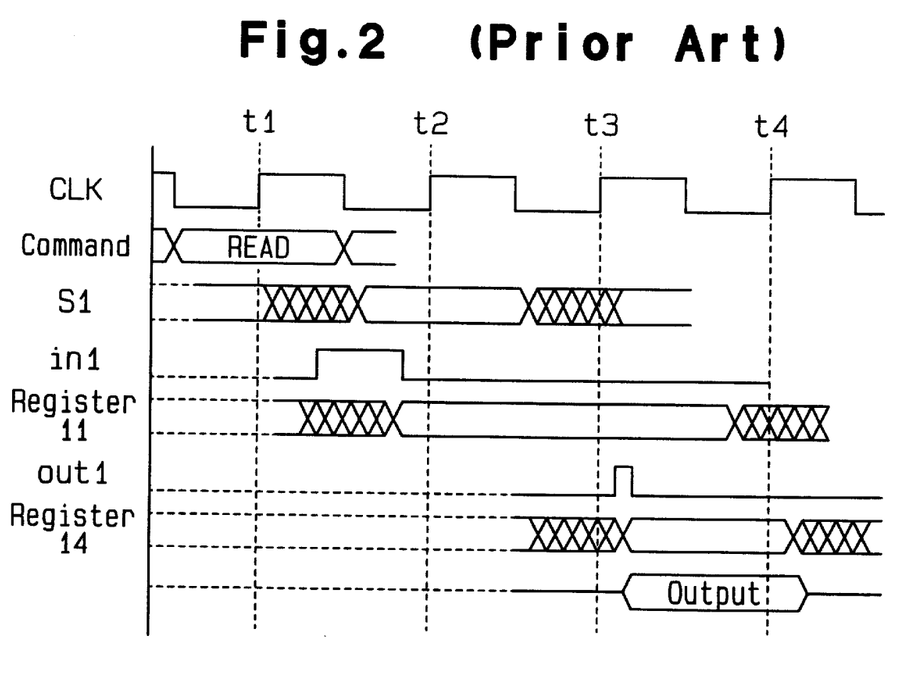
FIG. 2 is a combined timing and waveform chart illustrating the operation of the synchronous semiconductor memory device of FIG. 1.

FIG. 2 is a combined timing and waveform chart illustrating the operation of the SDRAM 200 when the CAS latency is set at a value of "3".

If the SDRAM 200 receives a read command when the external clock signal CLK goes high (time t1 ), the read amplifier 1 amplifies the data read from a memory cell and provides the amplified read data signal S1 to the register block 3. This first activates the transfer gate Ti1 of the register block 3 based on the control signal in1 and latches the read data S1 with the register 11. Based on the control signal out1, the transfer gate To1 is then activated and the read data signal S1 is transferred to the register 14. Afterward, the output data becomes effective based on the external clock signal CLK (time t4 ).

The parallel connection of the three registers 11–13 divides a read circuit into a plurality of operational stages. Thus, the read circuit is controlled as a parallel-connected pipeline. In response to high operational frequencies, the SDRAM 200 receives continuous commands and easily performs data read control.

When the CAS latency is set at the value of "1", the transfer gates Ti1, To1 are constantly activated. Thus, at time t2, the read data signal S1 is provided to the output circuit 2 via the registers 11, 14 and the output data becomes effective.

Further, if the CAS latency is set at the value of "1", the output data must become effective when the clock signal CLK goes high in the cycle following the cycle during which the read command is received (time t2 ). For example, if data is immediately read from the read command in the same manner as random access, the CAS latency is set at "1".

However, the register block 3, which is arranged along the output route of the read data signal S1 to perform pipeline control, prolongs access time. The access time refers to the time from when the SDRAM 200 receives the read command to when the read data is output.

Figure 3:
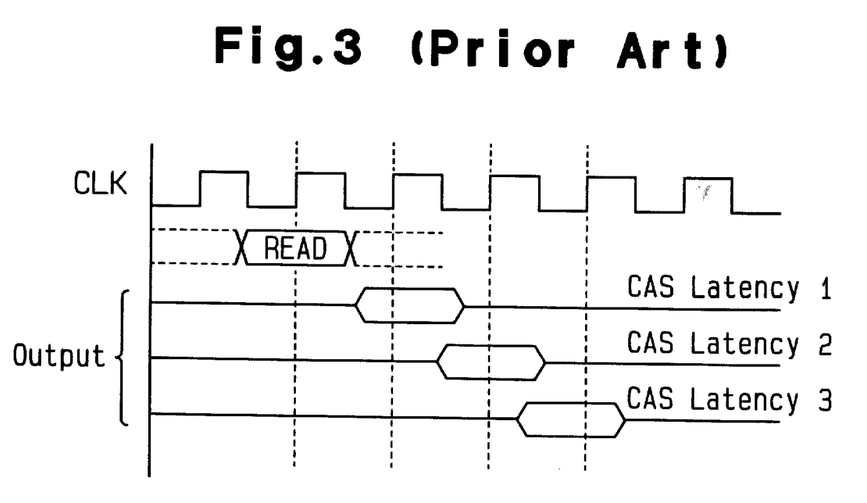
FIG. 3 is a combined timing and waveform chart illustrating data corresponding to CAS latencies of the synchronous semiconductor memory device of FIG. 1.

As shown in FIG. 3, when the CAS latency is set at the value of "1", the necessary access time is shorter in comparison to when the CAS latency is set at the values of "2" or "3". Thus, the margin in operational time of internal circuits is small, and the access time may be insufficient.

SUMMARY OF THE INVENTION

It is an object of the present invention to provide a synchronous semiconductor memory device that ensures that the access time is shortened when the CAS latency is set at a minimal value.

To achieve the above object, the present invention provides a synchronous semiconductor memory device. The device includes memory cells for storing data, a read amplifier connected to the memory cells for amplifying data read from one of the memory cells to generate an amplified read data signal, and a register block connected to the read amplifier for receiving the amplified read data signal in response to a clock signal to generate a latched read data signal. The register block outputs the latched read data signal based on latency information. A switching control circuit is connected to the register block for outputting one of the amplified read data signal and the latched read data signal based on the latency information. The switching control circuit outputs the amplified read data signal when a value of the latency information is set to one.

The present invention also provides a synchronous semiconductor memory device including memory cells for storing data, a read amplifier connected to the memory cells for amplifying data read from one of the memory cells to generate an amplified read data signal, and a register block connected to the read amplifier for receiving the amplified read data signal in response to a clock signal to generate a latched read data signal. The register block outputs the latched read data signal based on latency information. A control circuit generates a switch control signal based on the latency information. A first signal route is connected to the read amplifier to bypass the register block. A second signal route is connected to the read amplifier via the register block. A switching circuit is connected to the first and second routes for outputting one of the amplified read data signal and the latched read data signal.

The present invention further provides a method for reading data stored in memory cells of a synchronous semiconductor memory device. The semiconductor memory device includes a read amplifier for amplifying data read from one of the memory cells, a register block for receiving the amplified data in response to a clock signal and outputting the latched data based on latency information, a first signal route connected to the read amplifier to bypass the register block, and a second signal route connected to the read amplifier via the register block. The method includes selecting one of the first and second signal routes based on the latency information, and outputting the data associated with the selected signal route.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 4:
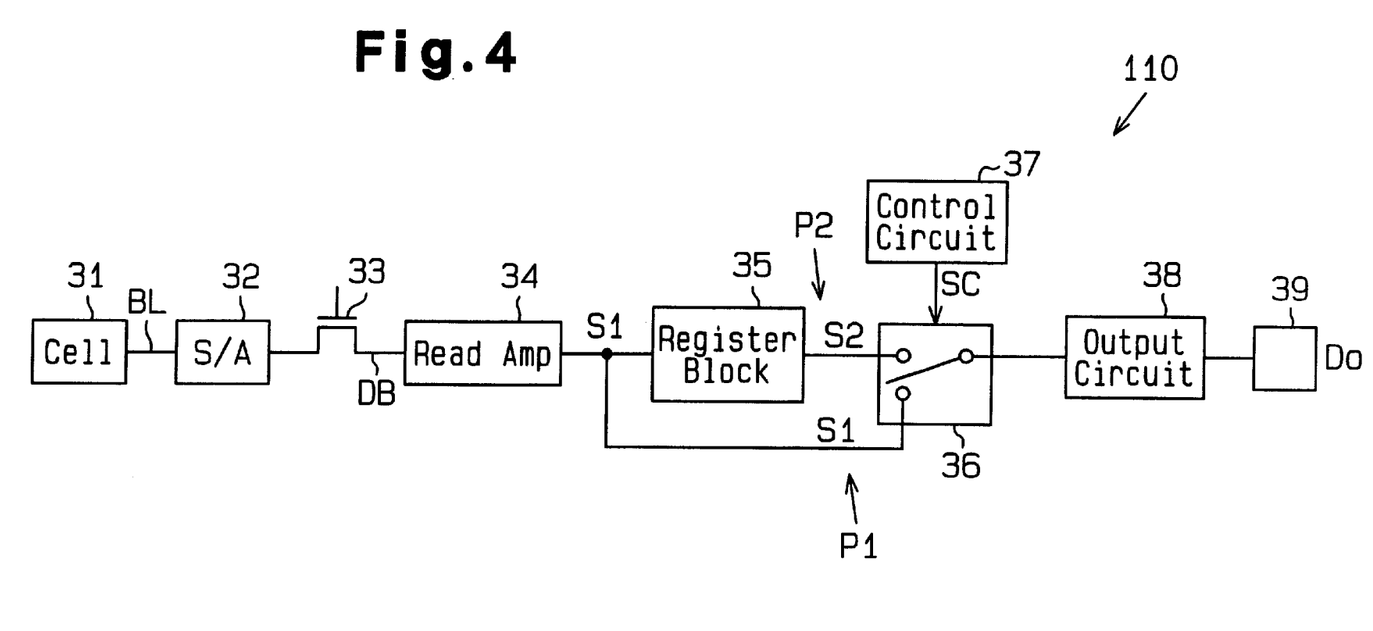
FIG. 4 is a schematic partial block circuit diagram of a synchronous semiconductor memory device according to a first embodiment of the present invention.

FIG. 4 is a schematic partial block circuit diagram of a synchronous semiconductor memory device (SDRAM) 110 according to a first embodiment of the present invention.

FIG. 4 illustrates a route through which data read from a memory cell 31 of the SDRAM 110 is transferred to an external pin 39.

The memory cell 31 is connected to a sense amplifier (S/A) 32 via a bit line BL. The sense amplifier 32 is connected to a read amplifier 34, which has a latch function, via a column gate 33 and a data bus DB.

The output terminal of the read amplifier 34 is connected to a register block 35. The output terminal of the register block 35 is connected to a switching circuit 36. The switching circuit 36 has a first input terminal and a second input terminal. The first input terminal is connected to a bypass route (first route) P1 through which a first read data signal S1 is directly received from the read amplifier 34. The second input terminal is connected to a second route P2, which is connected to the read amplifier 34 via the register block 35.

The switching circuit 36 receives a control signal SC from a control circuit 37. The output terminal of the switching circuit 36 is connected to an output circuit 38. That is, the register block 35 and the switching circuit 36 are connected between the read amplifier 34 and the output circuit 38. The output terminal of the output circuit 38 is connected to the external pin 39.

The memory cell 31 is selected based on an address signal, which is received by the SDRAM 110 together with the read command. The data read from the selected memory cell 31 is provided to the sense amplifier 32 via the bit line BL. The sense amplifier 32 amplifies the read data. When the column gate 33 is activated by the address signal, the amplified read data is provided to the read amplifier 34 via the column gate 33 and the data bus DB.

The read amplifier 34 amplifies the read data and generates a first read data signal S1. Then the read amplifier 34 provides the first read data signal S1 to the register block 35 and the switching circuit 36. The register block 35 latches the first read data signal S1 based on the control signal to generate a second read data signal S2. Then, the register block 35 provides the second read data signal S2 to the switching circuit 36. The control signal is generated in correspondence with a CAS latency stored in a first mode register (not shown).

The control circuit 37 generates the control signal SC at a low level when the CAS latency is set at a value of "2" or greater and generates the control signal SC at a high level when the CAS latency is set at a value of "1". The control signal SC is provided to the switching circuit 36.

Based on the control signal SC, the switching circuit 36 provides the first read data signal S1 or the second read data signal S2 to the output circuit 38. In the first embodiment, the switching circuit 36 provides the output circuit 38 with the first read data signal S1 in correspondence with the high control signal SC and the second read data signal S2 in correspondence with the low control signal SC.

Therefore, when the CAS latency is set at a value of "2" or greater, the second read data signal S2 is provided to the output circuit 38. When the CAS latency is set at a value of "1", the first read data signal S1 is provided to the output circuit 38. In other words, the first read data signal S1 bypasses the register block 35 when the first mode register sets the value of the CAS latency to "1". This shortens the access time.

Figure 5:
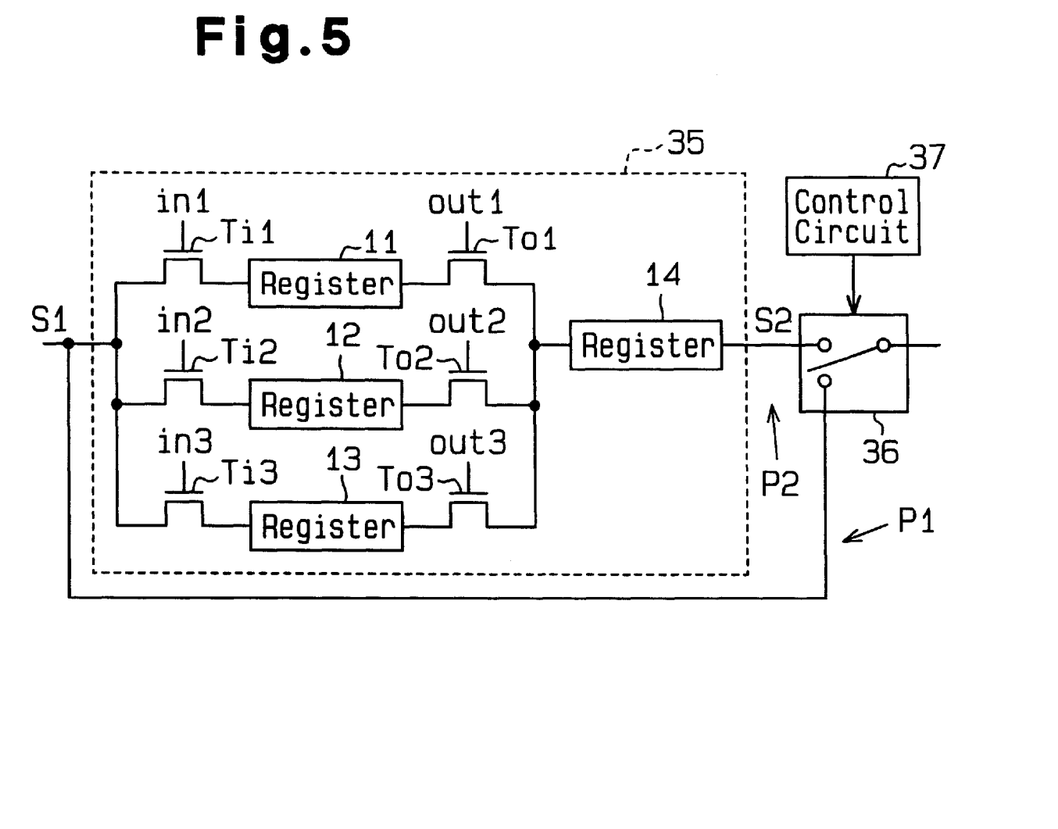
FIG. 5 is a schematic block circuit diagram of a register block of the synchronous semiconductor memory device of FIG. 5.

FIG. 5 is a schematic block circuit diagram of the register block 35 incorporated in the SDRAM 110. The register block 35 includes three registers 11, 12, 13, which are connected in parallel, and a register 14. The input terminal of the register 11 is connected to a transfer gate Ti1, and the output terminal of the register 11 is connected to a transfer gate To1. The input terminal of the register 12 is connected to a transfer gate Ti2, and the output terminal of the register 12 is connected to a transfer gate To2. The input terminal of the register 13 is connected to a transfer gate Ti3, and the output terminal of the register 13 is connected to a transfer gate To3. The register 14 is connected in series to the parallel-connected registers 11–13.

Figure 6:
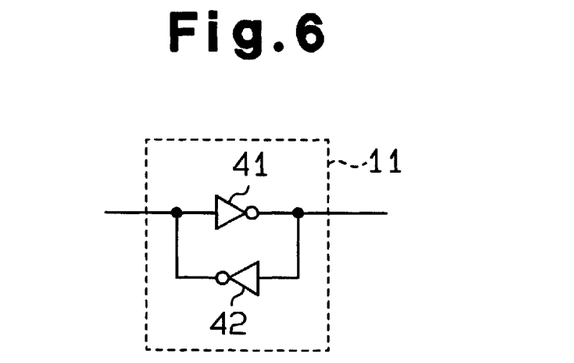
FIG. 6 is a circuit diagram of a register incorporated in the register block of FIG. 5.

The transfer gates Ti1, Ti2, Ti3 are respectively activated and deactivated by first control signals in1, in2, in3, which are generated in correspondence with the CAS latency. The transfer gates To1, To2, To3 are respectively activated and deactivated by second control signals out1, out2, out3, which are generated in correspondence with the CAS latency. The registers 11–14 latch the first read data signal S1 in correspondence with the value of the CAS latency to generate the second read data S2. As shown in FIG. 6, the register 11 preferably contains two inverter circuits 41, 42.

Figure 7:
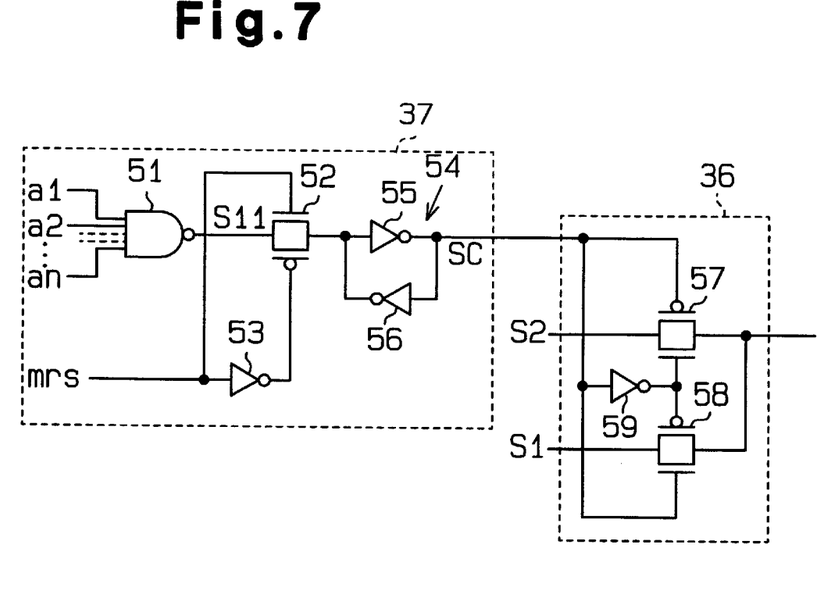
FIG. 7 is a schematic circuit diagram of a control circuit and a switching circuit of the synchronous semiconductor memory device of FIG. 4.

FIG. 7 is a schematic circuit diagram of the control circuit 37 and the switching circuit 36.

The control circuit 37 includes a NAND circuit 51, a switch 52, an inverter 53, and a latch circuit (second mode register) 54.

The NAND circuit 51 has a plurality of input terminals to receive address signals a1–an from an address buffer (not shown). The output terminal of the NAND circuit 51 is connected to the latch circuit 54 via the switch 52. The NAND circuit 51 generates a NAND signal S11 based on the address signals a1–an. The CAS latency is set by the first mode register based on the address signals a1–an. When the first mode register sets the value of the CAS latency to "1", the NAND signal S11 generated by the NAND circuit 51 goes low.

When the first mode register sets the CAS latency to a value of "2" or greater, the NAND signal S11 goes high.

The switch 52 includes a p-channel MOS transistor and an n-channel MOS transistor, which are connected in parallel. The gate of the NMOS transistor receives a mode register signal mrs, and the gate of the PMOS transistor receives the mode register signal mrs via the inverter 53. The mode register signal mrs activates and deactivates the switch 52.

The mode register set signal mrs is activated and goes high when the first and second mode registers set the CAS latency. When the CAS latency is set and the switch 52 is activated, the latch circuit 54 receives the NAND signal S11 in correspondence with the CAS latency.

The latch circuit (second mode register) 54 includes two inverters 55, 56, which are connected in a loop-like manner. The latch circuit 54 latches the NAND signal S11, inverts the NAND signal S11 to generate the control signal SC, and provides the control signal SC to the switching circuit 36.

Before the SDRAM 110 receives the read command, the latch circuit 54 latches the NAND signal (CAS latency) S11. More specifically, the latch circuit 54 latches the NAND signal S11 one or more clocks of the clock signal CLK before the read command is received.

The latch circuit 54 latches the high NAND signal S11 when the CAS latency is set at the value of "2" and latches the low NAND signal S11 when the CAS latency is set at the value of "1". Accordingly, the control signal SC is low when the value of the CAS latency is "2" or greater and high when the value of the CAS latency is "1".

In this manner, the control circuit 37 generates and holds the control signal SC based on the CAS latency, which is predetermined by the second mode register, and provides the control signal SC to the switching circuit 36.

The switching circuit 36 includes a first switch 57, a second switch 58, and an inverter 59. The first switch 57 is connected between the register block 35 and the output circuit 38. The second switch 58 is connected between the read amplifier 34 and the output circuit 38.

The first switch 57 has a PMOS transistor and an NMOS transistor connected in parallel. The gate of the PMOS transistor receives the control signal SC, and the gate of the NMOS transistor receives the control circuit SC via the inverter 59.

The second switch 58 has a PMOS transistor and an NMOS transistor connected in parallel. The gate of the NMOS transistor receives the control signal SC, and the gate of the PMOS transistor receives the control circuit SC via the inverter 59. Thus, the first and second switches 57, 58 are activated and deactivated in a complementary manner. The activated one of the first and second switches 57, 58 provides the associated first and second read data signals S1, S2 to the output circuit 38. Since both switches 57, 58 are configured by MOS transistors, signals are barely delayed.

Figure 8:
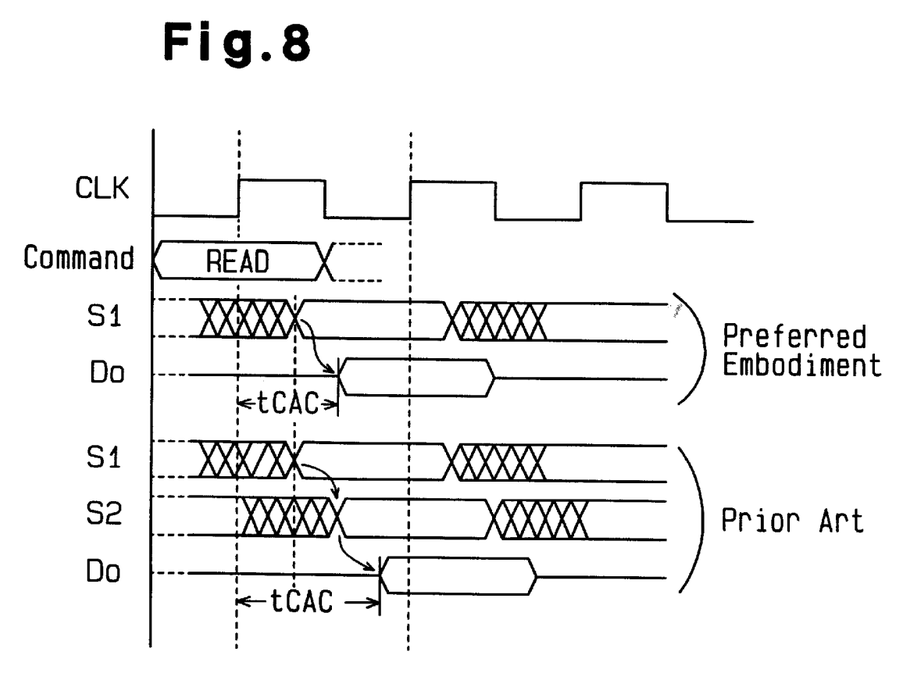
FIG. 8 is a combined timing and waveform chart illustrating the operation of the synchronous semiconductor memory device of FIG. 4.

The data read mode performed by the SDRAM 110 when the value of the CAS latency is "1" will now be discussed. FIG. 8 is a combined timing and waveform chart illustrating the operation of the SDRAM 110.

When the SDRAM 110 receives a mode register set command, the first mode register sets the value of the CAS latency to "1" based on the address signals a1–an.

As a result, the control circuit 37 causes the NAND signal S11 to go low and provides the high control signal SC to the switching circuit 36. Based on the high control signal SC, the switching circuit 36 deactivates the first switch 57 and activates the second switch 58.

Then, with reference to FIG. 8, when the external clock signal CLK goes high, the SDRAM 110 receives the read command and reads data from the memory cell 31. The SDRAM 110 receives the read command when one or more clocks of the external clock CLK elapse after the CAS latency is set. The read data is provided to the switching circuit 36 via the read amplifier 34. Since the second switch 58 of the switching circuit 36 is activated, the first read data signal S1 is provided to the output circuit 38. In other words, in the SDRAM 110, when the value of the CAS latency is "1", the first read data signal S1 is provided to the output circuit 38, bypassing the register block 35. Thus, the first read data signal S1 is not delayed by the register block 35.

Accordingly, as shown in FIG. 8, the access time tCAC of the SDRAM 110 is shortened in comparison to that of the prior art SDRAM. The access time tCAC refers to the time from when the clock signal CLK goes high, during which the SDRAM 110 receives the read command, to when the read data is provided to the external pin 39.

The SDRAM 110 of the first embodiment has the advantages described below.

(1) The control circuit 37 provides the switching circuit 36 with the control signal SC in correspondence with the predetermined CAS latency. Based on the control signal SC, the switching circuit 36 provides the second signal S2 to the output circuit 38 from the register block 35 if the value of the CAS latency is two or greater. The switching circuit 36 provides the first signal S1 from the read amplifier 34, which has a latch function, to the output circuit 38 when the value of the CAS latency is "1". This shortens the access time when the CAS latency is set at the value of "1" due to the time saved by bypassing the register block 35.

(2) Based on the address signals a1–an, the CAS latency is set in correspondence with the mode register command. Further, based on the address signals a1–an, the control circuit 37 generates and latches the control signal SC. Thus, when the SDRAM 110 receives the read command, the switching circuit 36 is controlled by the control signal SC so that, for example, the first signal S1 is provided to the output circuit 38. In other words, high-speed reading is enabled since the switching circuit 36 does not have to perform switching control when reading data.

Second Embodiment

Figure 10:
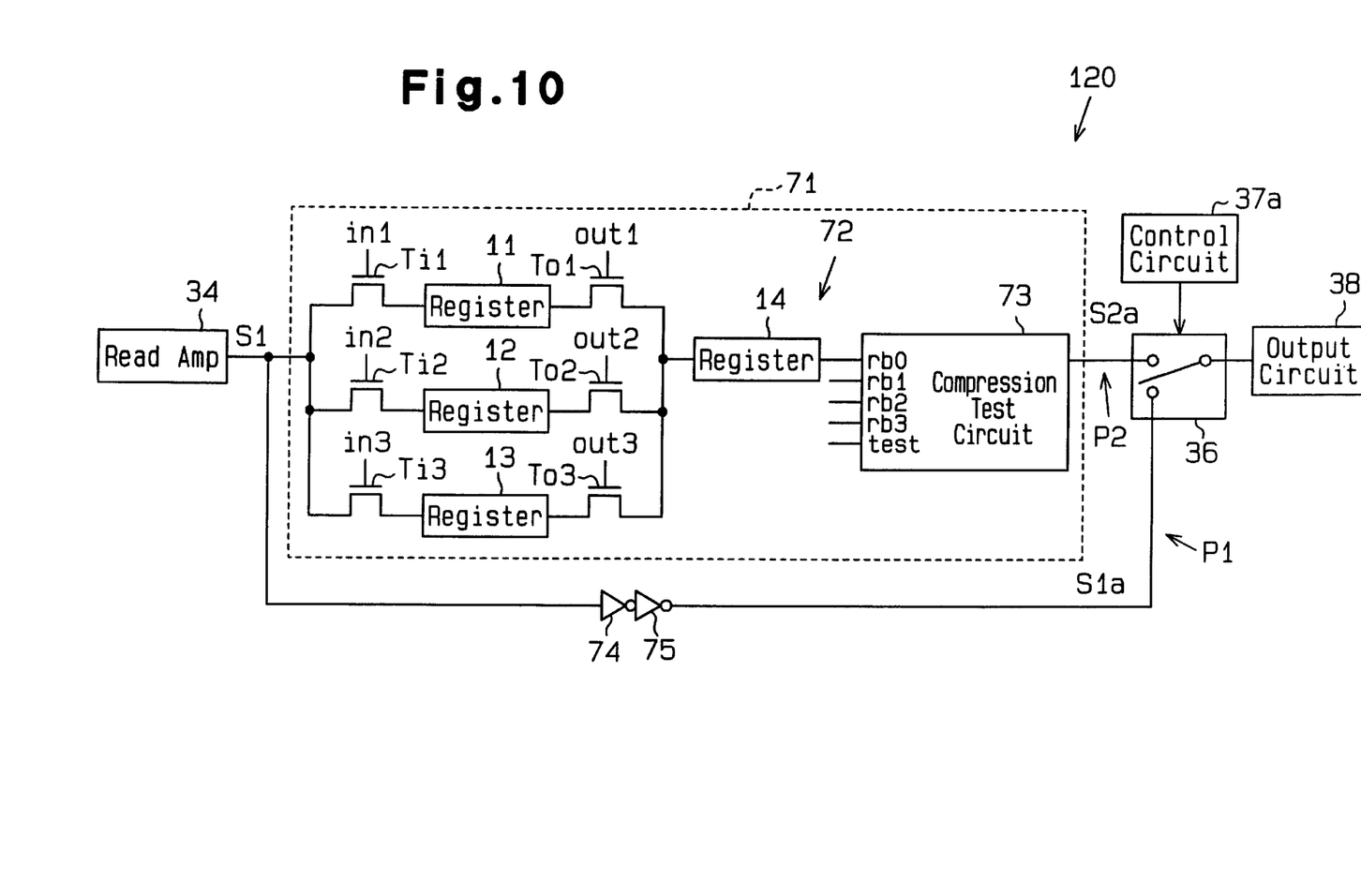
FIG. 10 is a schematic partial block circuit diagram of a synchronous semiconductor memory device according to a second embodiment of the present invention.

FIG. 10 is a schematic partial block circuit diagram of a synchronous semiconductor memory device (SDRAM) 120 according to a second embodiment of the present invention. The route of read data read between the memory cell 31 and the external pin 39 is shown in FIG. 10.

The SDRAM 120 of the second embodiment includes a register block 71 and a switching circuit 36, which are located between a read amplifier 34 and an output circuit 38. The read amplifier 34 has a latch function.

The register block 71 has a test function. Further, the register block 71 includes a register unit 72, which includes the register block 35 of FIG. 5, and a compression test circuit 73.

The compression test circuit 73 compresses data having multiple bits and provides the compressed data to one of the external pins (not shown). The compression test circuit 73 shortens the time required to conduct a functional test on the SDRAM during final inspections at a vendor's plant. The SDRAM increases the bus width and inputs and outputs multiple bits.

During the compression test, the same data is written to a plurality of memory cells, and the data read from each memory cell are compared to determine whether they match. The determination result is a single bit of data. The value of the data is, for example, "0" when all of the read data of the multiple bits match and "1" when the read data do not match. Accordingly, when performing the functional test, the compression test circuit simultaneously tests cell information, the amount of which corresponds to the bus width, to produce a single bit of output data. This decreases the time required to perform the functional test.

In the second embodiment, the compression test circuit 73 compresses four bits of read data. The compression test circuit 73 is connected to four register units 72 (only one shown in FIG. 10). Thus, the compression test circuit 73 receives a total of four bits of read data rb0, rb1, rb2, and rb3 from the four register units 72.

The compression test circuit 73 further receives a compression test signal test. During a compression test mode when the compression test signal test is active, the compression test circuit 73 compresses the read data rb0–rb3 to generate a compression signal S2a and provides the compression signal S2a to the switching circuit 36. During a normal mode when the signal test is inactive, the compression test circuit 73 generates the second signal S2, whose signal level is the same as that of the read data rb0, and provides the second signal S2 to the switching circuit 36.

Two inverters 74, 75 are connected in series between the read amplifier 34 and the switching circuit 36. The inverters 74, 75 configure a buffer circuit. The inverters 74, 75 buffer the first read data signal S1 to generate a buffered read signal S1a and provide the buffered read signal S1a to the output circuit 38 via the switching circuit 36. The buffer circuit is not limited to the two series-connected inverters 74, 75 and may include other devices.

Figure 11:
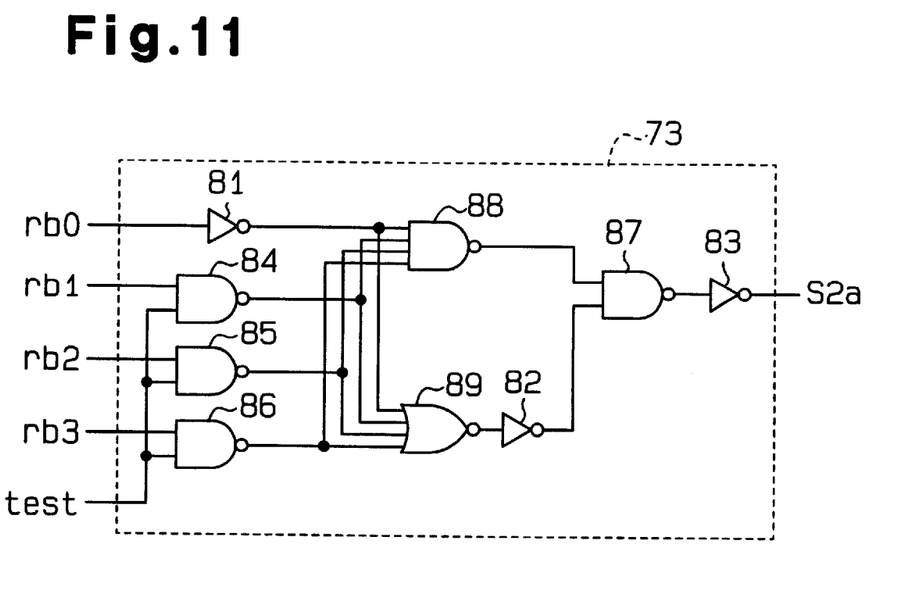
FIG. 11 is a schematic circuit diagram of a compression test circuit incorporated in the synchronous semiconductor memory device of FIG. 10.

FIG. 11 is a schematic circuit diagram of the compression test circuit 73. The compression test circuit 73 includes inverters 81, 82, 83, two-input NAND circuits 84, 85, 86, 87, a four-input NAND circuit 88, and a four-input NOR circuit 89.

The output terminal of the inverter 81, which receives the read data rb0, is connected to an input terminal of the NAND circuit 88 and an input terminal of the NOR circuit 89. The three NAND circuits 84–86 respectively receive the read data rb1–rb3 and the test signal test. The output terminals of the NAND circuits 84–86 are each connected to an input terminal of the NAND circuit 88 and an input terminal of the NOR circuit 89.

The output terminal of the NAND circuit 88 is connected to a first input terminal of the NAND circuit 87, and the output terminal of the NOR circuit 89 is connected to an input terminal of the inverter 82. The output terminal of the inverter circuit 82 is connected to a second input terminal of the NAND circuit 87. The output terminal of the NAND circuit 87 is connected to the input terminal of the inverter 83, and the inverter 83 outputs the compression signal S2a.

During the normal mode, the compression test signal test received by the compression test circuit 73 goes inactive (in the second embodiment, low). Based on the low compression test signal test, the NAND circuits 84–86 output signals having high levels. This causes the compression test circuit 73 to output the compression signal S2a at the same signal level as the read data rb0.

During the compression test mode, the compression test signal test received by the compression test circuit 73 goes active (in the second embodiment, high). Based on the high compression test signal test, the NAND circuits 84–86 output signals having the same level as the associated read data rb1–rb3. This causes the compression test circuit 73 to output the compression signal S2a at a low level when all of the read data rb0–rb3 are low or high. When the levels of the read data rb0–rb3 do not match, the compression test circuit 73 outputs the compression signal S2a at a high level.

Figure 12:
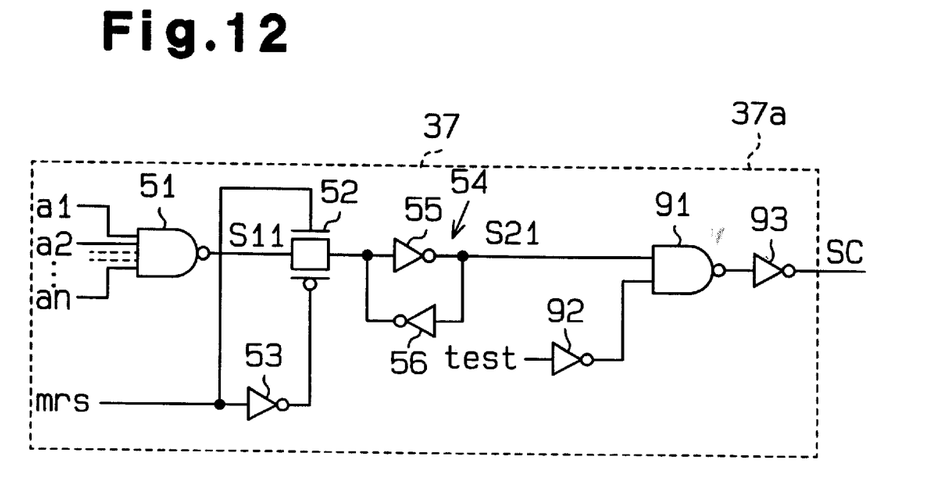
FIG. 12 is a schematic circuit diagram of a control circuit incorporated in the synchronous semiconductor memory device of FIG. 10.

FIG. 12 is a schematic circuit diagram of a control circuit 37a. In addition to the devices configuring the control circuit 37 of FIG. 7, the control circuit 37a further includes a NAND circuit 91 and inverters 92, 93. The NAND circuit 91 has a first input terminal, which receives a latched signal S21, and a second input terminal, which receives the inverted test signal test via the inverter 92. The output terminal of the NAND circuit 91 is connected to an input terminal of the inverter 93. The control signal SC is output from the inverter 93.

The operations of a normal mode and a test mode of the SDRAM 120 will now be described.

Operation Mode

Figure 13:
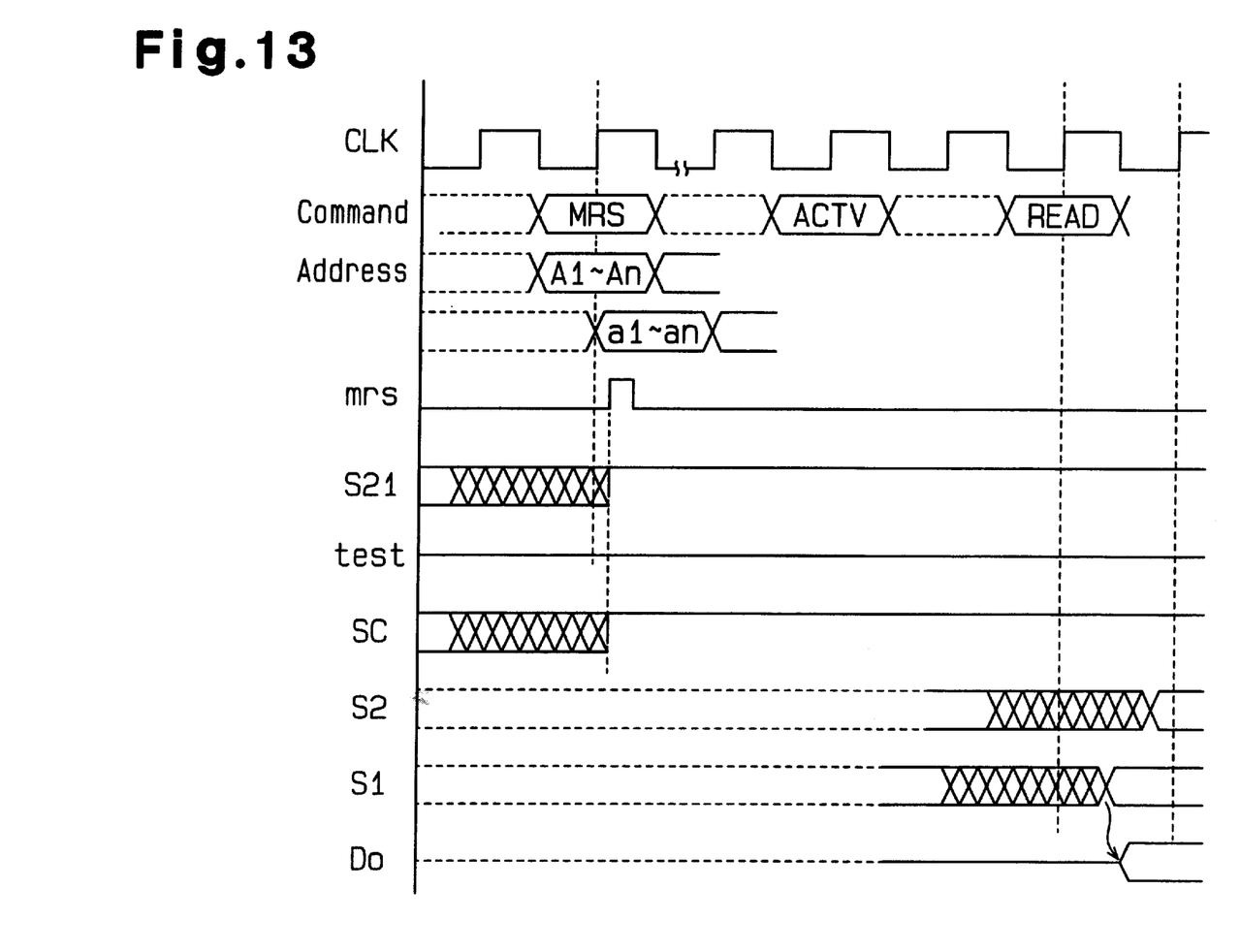
FIG. 13 is a combined timing and waveform chart illustrating the operation of the synchronous semiconductor memory device of FIG. 10 in a normal mode.

FIG. 13 is a combined timing and waveform chart illustrating the operation of the SDRAM 120 in the normal mode. When the clock signal CLK goes high, the SDRAM 120 receives the mode register set command MRS. In this state, the SDRAM 120 generates internal address signals a1–an based on address signals A1–An, which are received from external devices. Then, the SDRAM 120 sets the CAS latency at the value of "1" with the first mode register based on the internal address signals a1–an.

Based on the internal address signals a1–an, the latch circuit 54 of the control circuit 37a generates the latched signal S21 at a high level. Since the compression test signal test is low, the control circuit 37a provides the high control signal SC to the switching circuit 36. Based on the high control signal SC, the switching circuit 36 provides the bypassed read data, or buffered read signal S1a, to the output circuit 38.

When the SDRAM 120 receives a read command READ after receiving an active command ACTV, the SDRAM 120 reads data from a memory cell based on the read command. Since the buffered read signal S1a is received by the output circuit 38, a read output signal Do is determined before the clock signal CLK, which is used to output read data, goes high. The clock signal CLK used to output read data is the clock signal CLK following the clock signal CLK used to receive the read command.

Compression Test Mode

Figure 14:
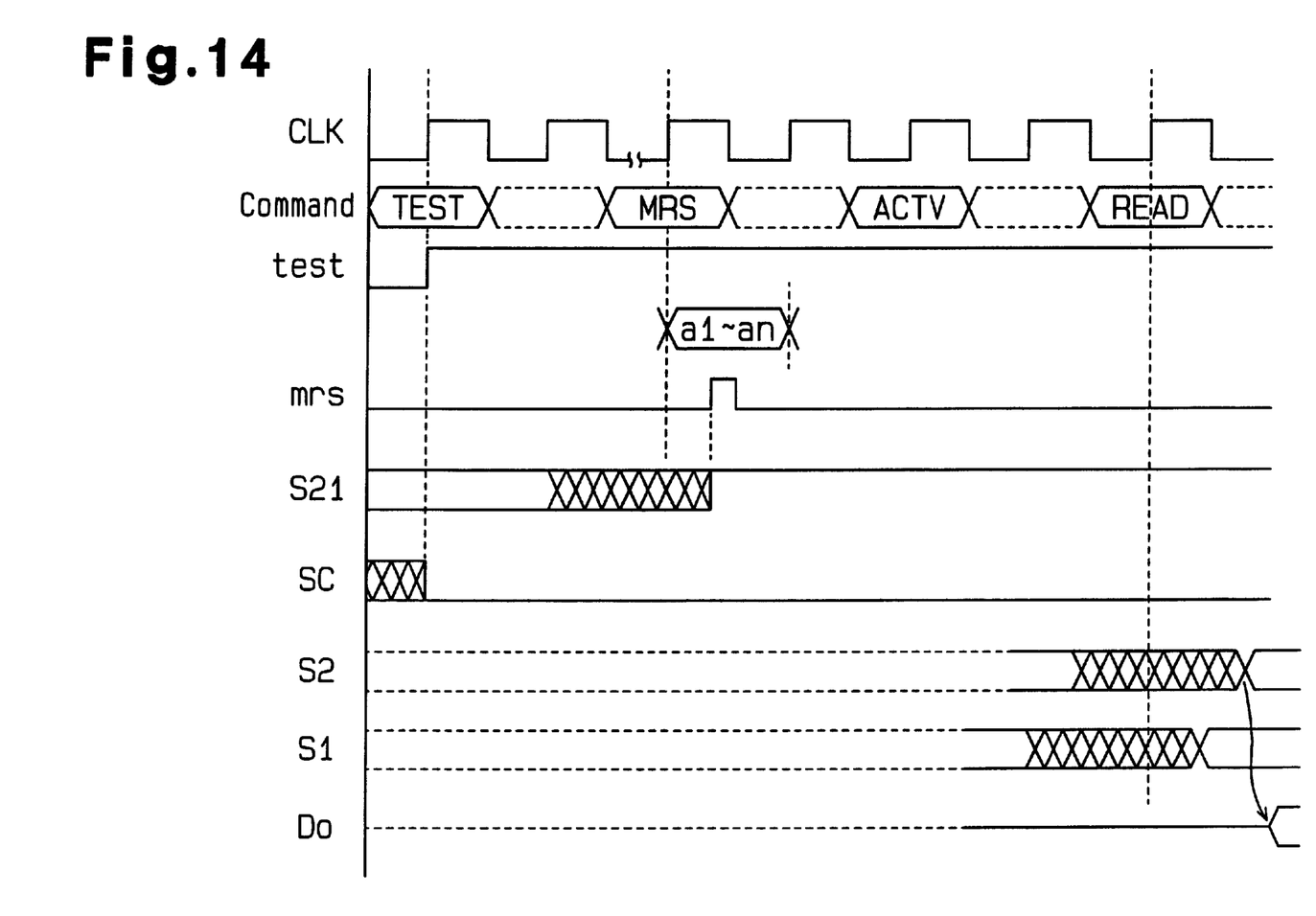
FIG. 14 is a combined timing and waveform chart illustrating the operation of the synchronous semiconductor memory device of FIG. 10 in a test mode.

FIG. 14 is a combined timing and waveform chart illustrating the operation of the compression test mode of the SDRAM 120. When the SDRAM 120 receives the test mode entry command TEST, the SDRAM 120 causes the compression test signal test to go high. In this state, the control circuit 37a provides the low control signal SC to the switching circuit 36. Thus, the switching circuit 36 provides the compression signal S2a from the register block 71 to the output circuit 38.

Then, when the SDRAM 120 receives the mode register command MRS, the SDRAM 120 generates the internal address signals a1–an based on the present address signals A1–An. In response to the mode register set signal mrs, the SDRAM 120 sets the CAS latency at, for example, the value of "1". Since the compression test signal test is high, the control signal SC remains low regardless of the value of the CAS latency.

When the SDRAM 120 receives the read command READ after receiving the active command ACTV, the SDRAM 120 reads data from a memory cell in response to the read command. Compressed test data is output from external pins when the output circuit 38 receives the compression signal S2a.

The SDRAM 120 of the second embodiment has the advantages described below.

(1) When the value of the CAS latency is set at "1" during the normal operation, the control circuit 37a provides the output circuit 38 with data read from a memory cell by bypassing the register block 71. Since the data is not routed through the register block 71, which compresses data, access time is shortened.

(2) During the compression test mode, the control circuit 37a provides the signal of the register block 71 to the output circuit 38 regardless of the value of the CAS latency. This enables the compression test to be conducted regardless of the value of the CAS latency.

It should be apparent to those skilled in the art that the present invention may be embodied in many other specific forms without departing from the spirit or scope of the invention. Particularly, it should be understood that the present invention may be embodied in the following forms.

Figure 9:
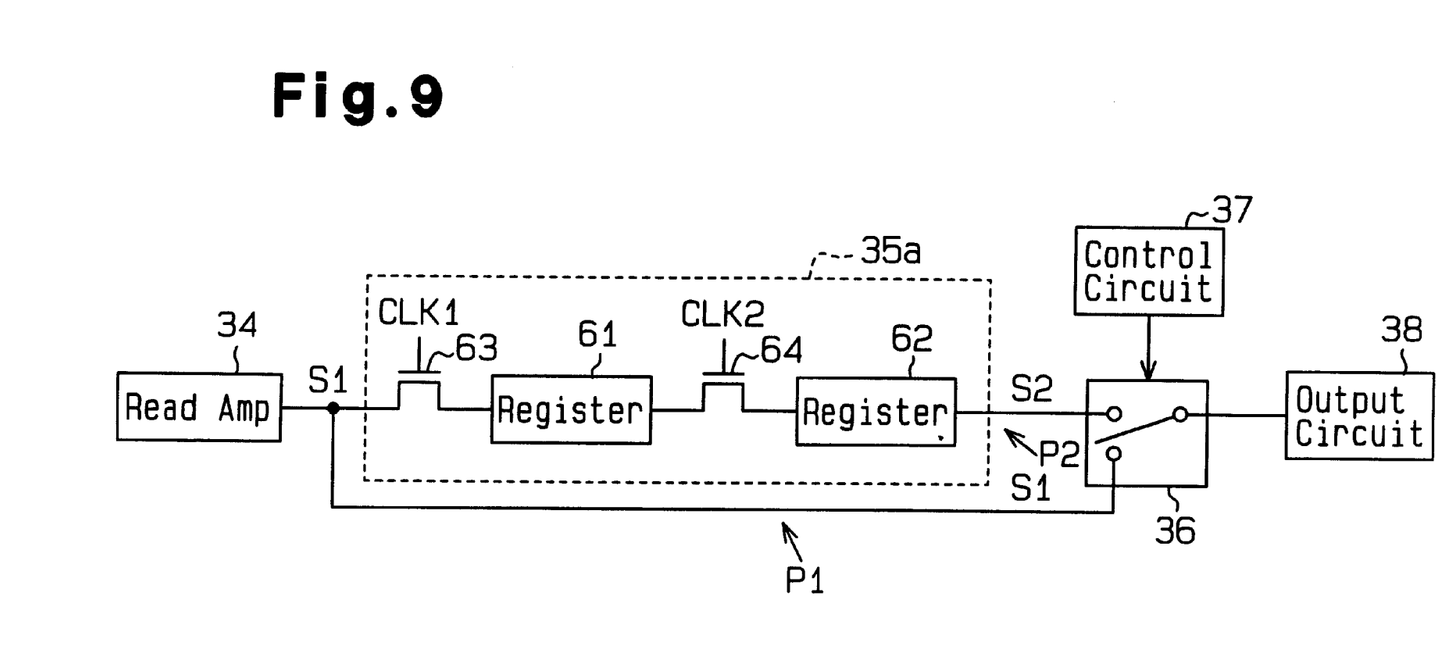
FIG. 9 is a schematic circuit diagram of a further register block.

The configuration of the register block 35 of FIG. 5 may be altered as described below. For example, referring to FIG. 9, a register block 35a may include two series-connected registers 61, 62 and transfer gates 63, 64, which are connected to the input and output terminals, respectively, of the register 61. When the value of the CAS latency is "2" or greater, the register block 35a activates and deactivates the gates 63, 64 based on the clock signals CLK1, CLK2 and latches the read data at the registers 61, 62. When the value of the CAS latency is "1", the register block 35a provides the bypass signal S1 to the output circuit 38. This decreases the access time of the read data.

The switching circuit 36 of FIG. 7 may be configured by logic gates having multiple inputs.

The switching circuit 36 may perform switching based on the second control signals out1, out2, out3 (FIG. 5).

The read amplifier 34 (FIG. 4, 9, and FIG. 10) need only amplify read data and is not required to have a latch function.

The compression test circuit 73 of the second embodiment may be changed to a compression test circuit that compresses read data having two bits or at least four bits.

The additional circuit of the register block 71 in the second embodiment is not limited to the compression test circuit 73.

The two series-connected inverters 74, 75 arranged in the bypass route of FIG. 10 may also be arranged in the bypass route of the first embodiment (FIG. 5).

The present examples and embodiments are to be considered as illustrative and not restrictive, and the invention is not to be limited to the details given herein, but may be modified within the scope and equivalence of the appended claims.

What is claimed is:

1. A synchronous semiconductor memory device comprising:
   memory cells for storing data;
   a read amplifier connected to the memory cells for amplifying data read from one of the memory cells to generate an amplified read data signal;
   a register block connected to the read amplifier for receiving the amplified read data signal in response to a clock signal to generate a latched read data signal, wherein the register block outputs the latched read data signal based on latency information; and
   a switching control circuit connected to the register block for outputting one of the amplified read data signal and the latched read data signal based on the latency information, wherein the switching control circuit outputs the amplified read data signal when a value of the latency information is set to one.

2. The synchronous semiconductor memory device according to claim 1, wherein the switching control circuit includes:
   a control circuit for generating a switching control signal based on the latency information; and
   a switching circuit connected to the read amplifier and the register block for outputting one of the amplified read data signal and the latched read data signal based on the switching control signal.

3. The synchronous semiconductor memory device according to claim 2, wherein the control circuit receives a latency setting signal for setting the latency information and generating the switching control signal based on the latency setting signal.

4. The synchronous semiconductor memory device according to claim 3, wherein the latency information is column address strobe (CAS) latency information, and the first piece of latency information indicates that the value of the CAS latency is one.

5. The synchronous semiconductor memory device according to claim 2, wherein the register block compresses a plurality of read data signals to generate a compressed read data signal when the semiconductor memory device enters a test mode, and the control circuit generates the switching control signal so that the switching circuit outputs the compressed read data signal during the test mode.

6. A synchronous semiconductor memory device comprising:

memory cells for storing data;

a read amplifier connected to the memory cells for amplifying data read from one of the memory cells to generate an amplified read data signal;

a register block connected to the read amplifier for receiving the amplified read data signal in response to a clock signal to generate a latched read data signal, wherein the register block outputs the latched read data signal based on latency information;

a control circuit for generating a switch control signal based on the latency information;

a first signal route connected to the read amplifier to bypass the register block;

a second signal route connected to the read amplifier via the register block; and a switching circuit connected to the first and second routes for outputting one of the amplified read data signal and the latched read data signal.

7. The synchronous semiconductor memory device according to claim 6, wherein a signal delaying time of the second signal route is longer than a signal delaying time of the first signal route.

8. The synchronous semiconductor memory device according to claim 7, wherein the latency information is CAS latency information.

9. A method for reading data stored in memory cells of a synchronous semiconductor memory device, wherein the semiconductor memory device includes a read amplifier for amplifying data read from one of the memory cells, a register block for receiving the amplified data in response to a clock signal and outputting the latched data based on latency information, a first signal route connected to the read amplifier to bypass the register block, and a second signal route connected to the read amplifier via the register block, the method comprising the steps of:

selecting one of the first and second signal routes based on the latency information; and outputting the data associated with the selected signal route.

10. The method for reading data according to claim 9, wherein the step for selecting the signal route includes selecting one of the first and second signal routes based on the CAS latency information.

11. The method for reading data according to claim 9, further comprising the steps of:

setting the latency information at a time that is one or more clocks of the clock signal before the synchronous semiconductor memory device receives a read command for reading data from the memory cells.

12. The method for reading data according to claim 9, further comprising the steps of:

compressing data read from the memory cell to generate compressed data, wherein the step of outputting data outputs the compressed data through the second signal route regardless of the latency information during a test mode.

13. The method for reading data according to claim 9, wherein a signal delaying time of the second signal route is longer than a signal delaying time of the first signal route.

* * * * *

UNITED STATES PATENT AND TRADEMARK OFFICE
CERTIFICATE OF CORRECTION

PATENT NO. : 6,304,492 B2
DATED : October 16, 2001
INVENTOR(S) : Jun Watanabe

Page 1 of 1

It is certified that error appears in the above-identified patent and that said Letters Patent is hereby corrected as shown below:

<u>Title page,</u>
Item [30], please change the following information,
"Feb. 25, 2000  (JP) ................................. 12-049782" to
-- Feb. 25, 2000  (JP) ................................. 2000-049782 --

Signed and Sealed this

Second Day of April, 2002

Attest:

JAMES E. ROGAN
*Attesting Officer*    *Director of the United States Patent and Trademark Office*